United States Patent
Moon et al.

(10) Patent No.: US 8,809,901 B2
(45) Date of Patent: Aug. 19, 2014

(54) NANOWIRE LIGHT EMITTING DEVICE AND METHOD OF MANUFACTURING THE SAME

(75) Inventors: Won Ha Moon, Kyungki-do (KR);
Dong Woohn Kim, Kyungki-do (KR);
Jong Pa Hong, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1023 days.

(21) Appl. No.: 12/750,195

(22) Filed: Mar. 30, 2010

(65) Prior Publication Data
US 2010/0187498 A1    Jul. 29, 2010

Related U.S. Application Data

(62) Division of application No. 11/509,756, filed on Aug. 25, 2006, now Pat. No. 7,714,351.

(30) Foreign Application Priority Data

Aug. 25, 2005   (KR) .......................... 10-2005-0078448

(51) Int. Cl.
*H01L 33/32*    (2010.01)
(52) U.S. Cl.
USPC   257/103; 257/13; 257/E33.028; 257/E51.022; 438/22; 438/99; 977/949; 977/762
(58) Field of Classification Search
USPC ....................... 257/103; 438/22; 977/764, 946
See application file for complete search history.

(56) References Cited

U.S. PATENT DOCUMENTS

| 7,265,037 B2* | 9/2007 | Yang et al. ................... 438/497 |
| 7,541,623 B2* | 6/2009 | Yi et al. .......................... 257/98 |
| 8,022,432 B2* | 9/2011 | Yi et al. .......................... 257/99 |
| 2004/0252488 A1 | 12/2004 | Thurk |
| 2005/0082543 A1* | 4/2005 | Alizadeh et al. ................ 257/79 |
| 2005/0179052 A1* | 8/2005 | Yi et al. ....................... 257/183 |
| 2005/0199894 A1* | 9/2005 | Rinzler et al. .................. 257/94 |

FOREIGN PATENT DOCUMENTS

| WO | WO 03/070816 A1 | 8/2003 |
| WO | WO 2004/102684 A2 | 11/2004 |
| WO | WO 2005/017962 A2 | 2/2005 |
| WO | WO 2005017962 A2 * | 2/2005 |

OTHER PUBLICATIONS

Glatkowski et al. ("The Twists of Carbon Nanotubes." SPIE's oemagazine 123. Apr. 2005).*
Japanese Office Action issued in Japanese Patent Application No. 2006-229485, dated Jan. 12, 2010.

* cited by examiner

*Primary Examiner* — Cheung Lee
*Assistant Examiner* — Stephen Bradley
(74) *Attorney, Agent, or Firm* — McDermott Will & Emery LLP

(57) ABSTRACT

The invention provides a nanowire light emitting device and a manufacturing method thereof. In the light emitting device, first and second conductivity type clad layers are formed and an active layer is interposed therebetween. At least one of the first and second conductivity type clad layers and the active layer is a semiconductor nanowire layer obtained by preparing a layer of a mixture composed of a semiconductor nanowire and an organic binder and removing the organic binder therefrom.

8 Claims, 5 Drawing Sheets

(a)

(b)

(a)

(b)

(a)

(b)

(c)

NANOWIRE LIGHT EMITTING DEVICE AND METHOD OF MANUFACTURING THE SAME

RELATED APPLICATIONS

This application is a Divisional of U.S. application Ser. No. 11/509,756, filed on Aug. 25, 2006, now U.S. Pat. No. 7,714,351, claiming priority of Korean Patent Application No. 10-2005-0078448, filed on Aug. 25, 2005, the entire contents of each of which are hereby incorporated by reference.

BACKGROUND OF THE INVENTION

1. Field of the Invention

The present invention relates to a nanowire light emitting device, and more particularly a new type of light emitting device employing a semiconductor nanowire and a manufacturing method thereof.

2. Description of the Related Art

In general, a semiconductor light emitting device is configured as a PN junction structure using a compound semiconductor epitaxial layer as shown in FIG. 1. That is, a nitride semiconductor light emitting device 10 includes a first conductivity type nitride layer 14, an active layer of a multi quantum well structure 15, and a second conductivity type nitride semiconductor layer stacked in their order on a substrate 11. Also, a first electrode 18 is connected to the first conductivity type nitride layer 14 and a second electrode 19 is connected to the second conductivity type nitride semiconductor layer 17.

Such a semiconductor epitaxial layer of the first conductivity type nitride layer 14, the active layer 15 and the second conductivity type nitride layer 17 suffers a crystal defect due to differences in lattice constant and thermal expansion coefficient, thereby significantly deteriorating light emitting properties of the device. The crystal defect is more severely manifested in a nitride semiconductor. Especially when required to contain a relatively great proportion of In, an InGaN layer of the active layer 15 tends to have its wavelength shortened due to phase separation during growth. This gravely undermines reliability of the device.

Furthermore, for the conventional semiconductor light emitting device to emit light of different wavelengths, the active layer needs to have different compositions. This renders it difficult to manufacture a monolithic white light emitting device.

Recently, a junction device using a nanowire or a nanostick, in place of the epitaxial layer just described, has been vigorously studied. The nanostick is a device having a diameter of 100 nm, which carries physical properties different from those of a bulk structure. FIG. 2a illustrates a light emitting display 20 using such nanowires 25.

The display device 20 as shown in FIG. 2a has a transparent substrate 21 and a cover substrate 26 connected via insulating structures 29. The transparent substrate 21 has a lower electrode layer 23 made of e.g., ITO formed thereon and the cover substrate 26 has an upper electrode layer 27 formed on an underside thereof. The nanowires 25 are disposed between the insulating structures 29. The nanowires 25 feature a coaxial cable structure in which a p-type semiconductor material 25a and an n-type semiconductor material 25b are formed in a growth direction, as shown in FIG. 2b. The nanowires 25 emit light of a specific wavelength when a voltage is applied to the upper and lower electrode layers 27 and 23. The light emitted is convertible into a desired wavelength by a phosphor layer 28 formed underneath the transparent substrate 21.

However, the aforesaid method, which uses the nanowire emitting light of a specific wavelength, needs to employ a separate phosphor layer in order to produce white light. Also, the nanowires, when directly deposited as a PN junction device as in FIG. 2a, are hardly miniaturizable and individually arrangeable in a precise manner.

As described above, the nanowire light emitting device hardly produces a desired light, especially white light, thereby failing to develop into a light emitting device.

SUMMARY OF THE INVENTION

The present invention has been made to solve the foregoing problems of the prior art and therefore an object according to certain embodiments of the present invention is to provide a nanowire light emitting device having an active layer where a semiconductor nanowire device of a specific composition is dispersed unevenly.

Another object according to certain embodiments of the invention is to provide a method for manufacturing a nanowire light emitting device.

According to an aspect of the invention for realizing the object, there is provided a nanowire light emitting device comprising first and second conductivity type clad layers and an active layer interposed therebetween, wherein at least one of the first and second conductivity type clad layers and the active layer is a semiconductor nanowire layer obtained by preparing a layer of a mixture composed of a semiconductor nanowire and an organic binder and removing the organic binder therefrom.

Preferably, the at least one layer is the active layer. Here, the active layer may have various wavelengths. For example, the semiconductor nanowire of the active layer comprises at least two types of semiconductor materials emitting light at different wavelengths. Especially, in manufacturing a white light emitting device, the wavelengths of the semiconductor nanowire materials are combined to generate white light.

The semiconductor nanowire comprises a nitride semiconductor having a composition expressed by $Al_xGa_yIn_{1-x-y}N$, where $0 \leq x \leq 1$ and $0 \leq y \leq 1$. The semiconductor nanowire is 70 to 95 volume % of the mixture.

To be connected to overlying and underlying layers, preferably, the semiconductor nanowire has a length greater than 1.5 times or more with respect to a thickness of any of the first and second conductivity type clad layers and the active layer including the semiconductor nanowire.

According to an embodiment of the invention, there is provided a nanowire light emitting device comprising first and second conductivity type clad layers and an active layer interposed therebetween, wherein at least one of the first and second conductivity type clad layers and the active layer is a semiconductor nanowire layer obtained by preparing a layer of a mixture composed of a semiconductor nanowire and a transparent conductive polymer, and curing the transparent conductive polymer.

The semiconductor nanowire is contained at 30 to 80 volume % of the active layer. The semiconductor nanowire has a length greater than 1.5 times or more with respect to a thickness of any of the first and second conductivity type clad layers and the active layer including the semiconductor nanowire.

Preferably, the transparent conductive polymer comprises one selected from a group consisting of polypyrrole, polyaniline, poly(3,4-ethylenedioxythiophene), polyacetylene, poly(p-phenylene), polythiophene, poly(p-phenylenevinylene) and poly(thienylen vinylene).

According to another aspect of the invention for realizing the object, there is provided a method for manufacturing a nanowire light emitting device, which includes first and second conductivity type clad layers and an active layer interposed therebetween, wherein at least one of the first and second conductivity type clad layers and the active layer is formed by steps of:

preparing a layer of a mixture composed of a semiconductor nanowire and an organic binder, and heating/pressurizing the mixture to remove the organic binder therefrom so as to form a semiconductor nanowire layer.

The mixture further comprises a dispersant for dispersing the semiconductor nanowire uniformly. The coating step is carried out by, including but not limited to, a process selected from a group consisting of spin coating, spraying, screen printing and ink jet printing.

According to another embodiment of the invention, there is provided a method for manufacturing a nanowire light emitting device, which includes first and second conductivity type clad layers and an active layer interposed therebetween, wherein at least one of the first and second conductivity type clad layers and the active layer is formed by steps of:

preparing a layer of a transparent conductive polymer having a semiconductor nanowire dispersed therein, and curing the transparent conductive polymer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 3:
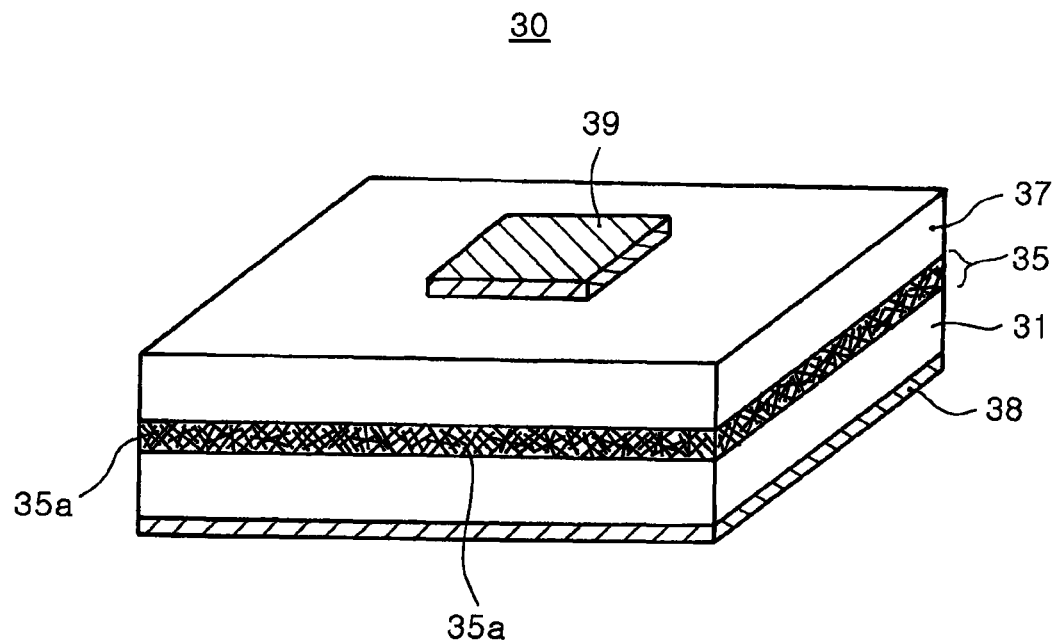
FIG. 3 is a cross-sectional view illustrating a nanowire light emitting device according to an embodiment of the invention.

FIG. 3 is a cross-sectional view illustrating a nanowire light emitting device 30 according to an embodiment of the invention.

Figure 1:
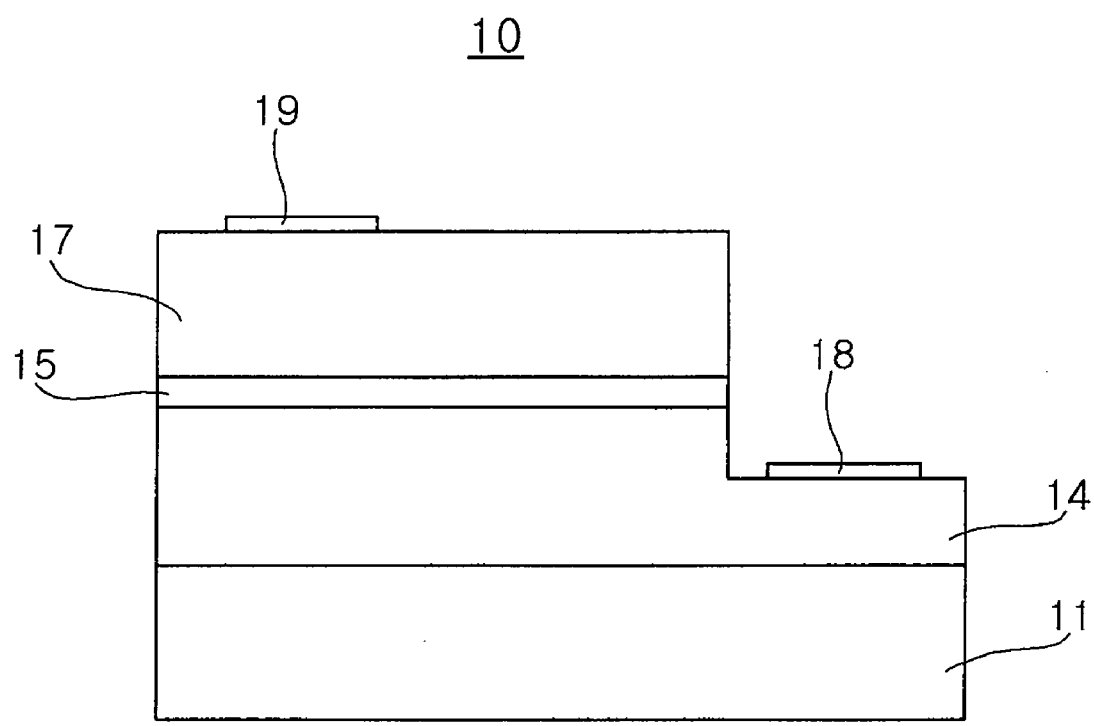
FIG. 1 is a cross-sectional view illustrating a conventional nitride light emitting device.
Figure 2:
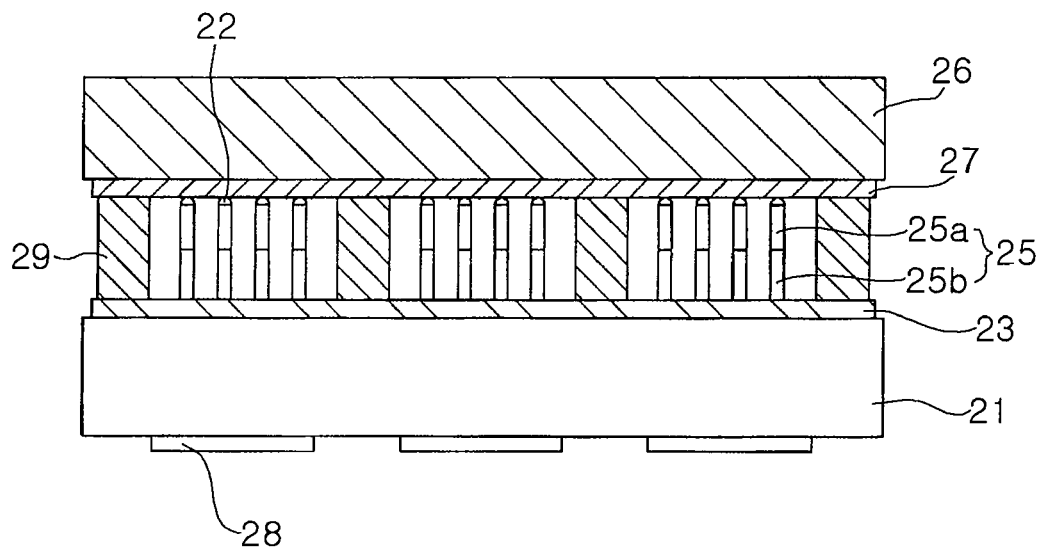
FIG. 2a is a cross-sectional view illustrating a conventional nanowire light emitting device.
FIG. 2b is a cross-sectional view illustrating a conventional semiconductor nanowire.
Figure 2:
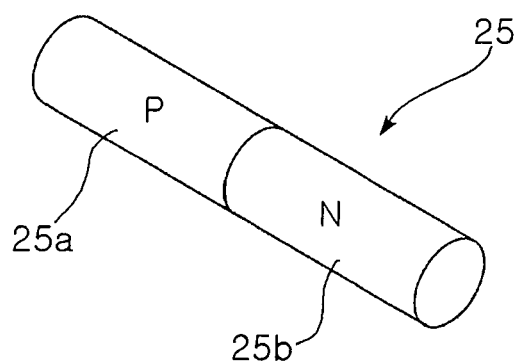

The nanowire light emitting device 30 as shown in FIG. 3 includes an active layer 35 interposed between first and second conductivity type clad layers 31 and 37, a first electrode connected to the first conductivity type clad layer 31 and a second electrode connected to the second conductivity type clad layer 37. In this embodiment, the first and second conductivity type clad layers 31 and 37 may be a semiconductor epitaxial layer obtained via a conventional deposition process. But the active layer 35 includes a semiconductor nanowire 35a. The semiconductor nanowire 35a is not configured as a PN junction structure as shown in FIG. 2b but composed of a specific conductivity type material or an undoped semiconductor material. In this embodiment, the semiconductor nanowire 35a of the active layer 35 may be a semiconductor material capable of emitting light of a specific wavelength. For example, the semiconductor nanowire is a nitride semiconductor having a composition expressed by $Al_xGa_yIn_{1-x-y}N$, where $0 \leq x \leq 1$ and $0 \leq y \leq 1$.

Of course, the semiconductor nanowire 35a of the invention is not limited to the material just described but may optionally include other GaAs-based or GaP-based semiconductor material.

The invention may employ two types of semiconductor nanowires composed of semiconductor materials with different compositions to form a single type of active layer 35. The active layer 35 generates light of at least two wavelengths from the nanowires. Also, the amount of the two different types of nanowires can be adjusted to easily set a ratio of the respective wavelengths.

Accordingly, such an active layer structure is advantageously applicable in manufacturing a monolithic white light emitting device. For example, semiconductor nanowires emitting red light, green light and blue light are mixed at an adequate ratio to generate white light. Then, the single active layer 35 is formed as shown in FIG. 3 to manufacture a desired monolithic white light emitting device.

To form the semiconductor nanowires 35a used in the invention, a mixture of the semiconductor nanowires and an organic binder is coated onto the first conductivity type clad layer 31 and then heated and/or pressurized to remove the organic binder therefrom. Here, preferably, a dispersant is used to uniformly disperse the semiconductor nanowires 35a within the organic binder. The removal of the organic binder leaves only the semiconductor nanowires as a layer. Therefore preferably, the nanowires are added at 70 to 95 volume % of the mixture. The semiconductor nanowires less than 70 volume % result in structural instability due to increase in a pore space ratio after removal of the organic binder. Preferably, the nanowires do not exceed 95 volume % to achieve sufficient bonding force.

Furthermore, to be active in the active layer 35a, the semiconductor nanowires 35a are necessarily in contact with the first and second conductivity type clad layers 31 and 37. Such contact can be ensured by a sufficient length of the semiconductor nanowires. That is, the nanowires 35a having a length greater than a thickness of the active layer are allowed to contact between the first and second conductivity type clad layers 31 and 37. Preferably, the semiconductor nanowires have a length greater than 1.5 times or more with respect to the active layer 35 including the nanowires.

As just described, the organic binder is used to form the semiconductor nanowires 35a into the active layer 35 but optionally the semiconductor nanowires 35a may be formed into the first or second conductivity type clad layer 31 or 37.

Moreover, the active layer 35 of the invention composed of the micro-structured nanowires 35a increases a total active area over a conventional bulk structure. As a result, the light emitting device of this embodiment advantageously exhibits higher light emitting efficiency than an equal-sized conventional device.

Figure 4:
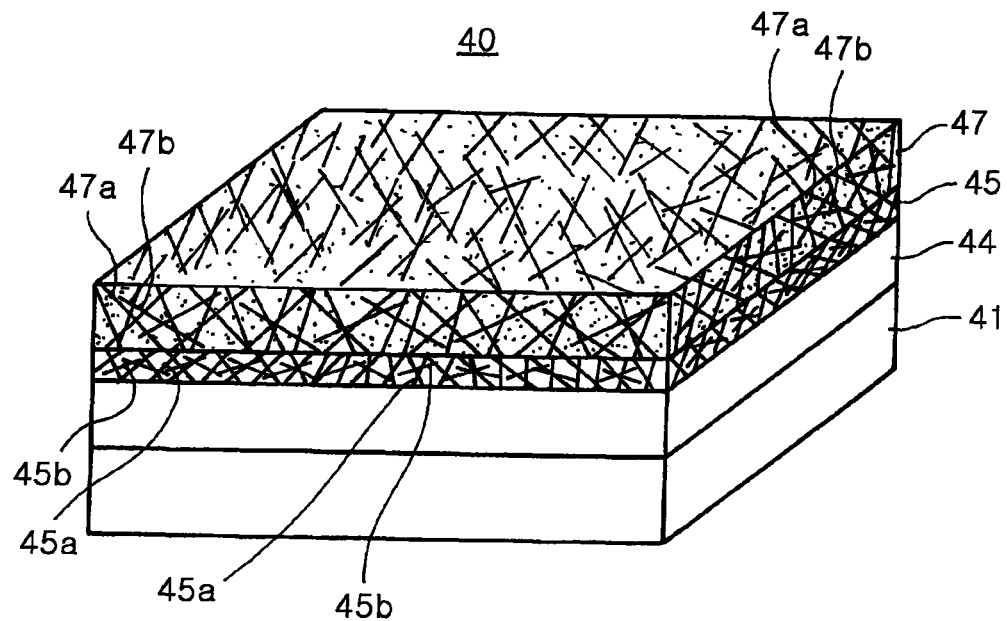
FIG. 4 is a cross-sectional view illustrating a nanowire light emitting device according to another embodiment of the invention.

According to this embodiment of the invention, the active layer 35 is composed of the semiconductor nanowires 35a. Alternatively the first or second conductivity type clad layer 31 or 37 may be formed similarly to the active layer 35. Also, this embodiment provides a method for forming the active layer of a nano structure by coating the mixture of the organic binder and semiconductor nanowires and removing the organic binder therefrom. In an alternative method of the invention, each layer may be formed of a transparent conductive polymer having semiconductor nanowires dispersed therein. FIG. 4 illustrates such an embodiment.

FIG. 4 is a cross-sectional view illustrating a nanowire light emitting device according to another embodiment of the invention.

As shown in FIG. 4, a nanowire light emitting device 40 includes a substrate 41, and a first conductivity type clad layer 44, an active layer 45 and a second conductivity type clad layer 47 stacked in their order on the substrate 41.

In this embodiment, the first conductivity type clad layer 44 alone may be a semiconductor epitaxial layer formed on the substrate via a conventional deposition process. On the other hand, the active layer 45 and the second conductivity type clad layer 47 respectively are made of a mixture of a semiconductor nanowire powder 45a and 47a and a conductive polymer 45b and 47b. Here, the semiconductor nanowire powder 45a of the active layer 45 is composed of an undoped semiconductor while the semiconductor nanowire powder 47a of the second conductivity type clad layer 47 is composed of a second conductivity type semiconductor.

Also, the conductive polymer 45b of the active layer 45 is necessarily transparent but the conductive polymer 47b of the second conductivity type clad layer 47 may be a polymer having a low light transmissivity depending on a light exiting direction. For example, the conductive polymer 47b is not necessarily transparent when light exits toward the substrate 41.

In this embodiment, the active layer may be formed in a micro nanowire structure similarly to FIG. 3. The light emitting device of this invention exhibits a larger light emitting area than an equal-sized conventional device. The semiconductor nanowire 45a of the active layer 45 is mixed with at least two types of nanowires having different wavelengths at an adequate ratio, thereby easily obtaining a white light emitting device.

The semiconductor nanowire used in certain embodiments of the invention is not configured as a PN junction structure but made of a single composition semiconductor emitting light of a specific wavelength. For example, when used for the active layer, the nanowire is composed of a single undoped semiconductor material capable of emitting light of a specific wavelength. Meanwhile, when used for a specific conductivity type clad layer, the nanowire is composed of a single semiconductor material with a corresponding conductivity type. Such a semiconductor nanowire can be easily obtained by applying a known manufacturing technique.

Figure 5:
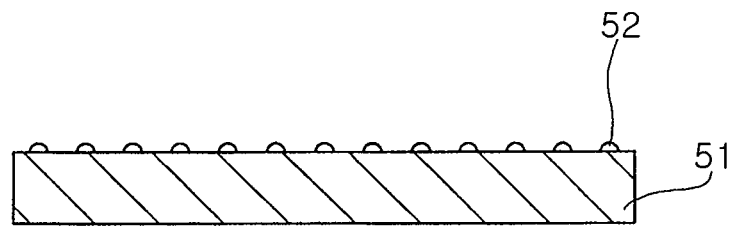
FIGS. 5a and 5b are cross-sectional views for explaining an exemplary process for manufacturing a nanowire used in the invention.
Figure 5:
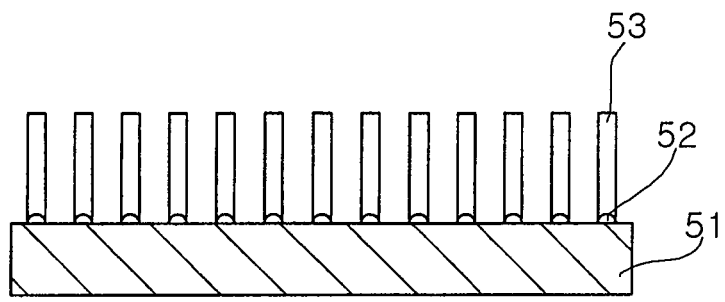

FIGS. 5a and 5b are cross-sectional views for explaining an exemplary process for manufacturing a semiconductor nanowire used in the invention.

First, as shown in FIG. 5a, a nano-sized catalyst metal pattern 52 is formed on a substrate 51. The catalyst metal pattern 52 is made of a transition metal such as nickel and chromium, which is coated on the substrate 51 and heated to be condensed into a nano size.

Then, as shown in FIG. 5b, a semiconductor is grown on each region of the catalyst metal pattern 52 via a proper deposition process. The semiconductor can be grown on the each region of the catalyst metal pattern 52 into a nanowire 53 having a diameter as wide as the region of the catalyst metal pattern 52. The nanowire 53 grown as just described is collected and then mixed with a conductive polymer and solvent to form a desired active layer or a clad layer.

Figure 6:
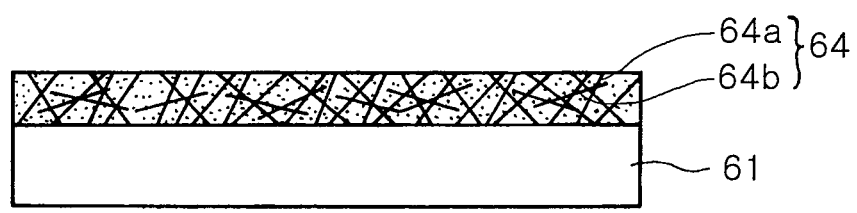
FIGS. 6a to 6c are cross-sectional views for explaining an exemplary process for manufacturing a nanowire light emitting device according to the invention.
Figure 6:
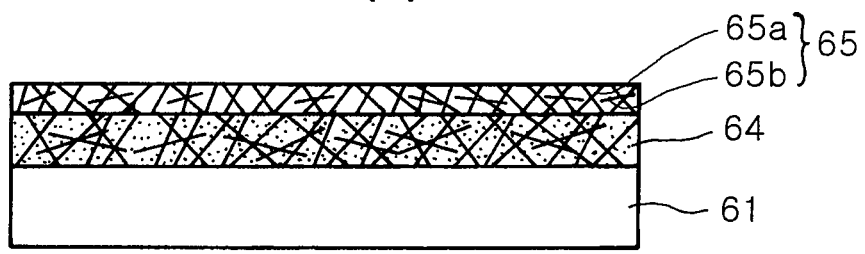
Figure 6:
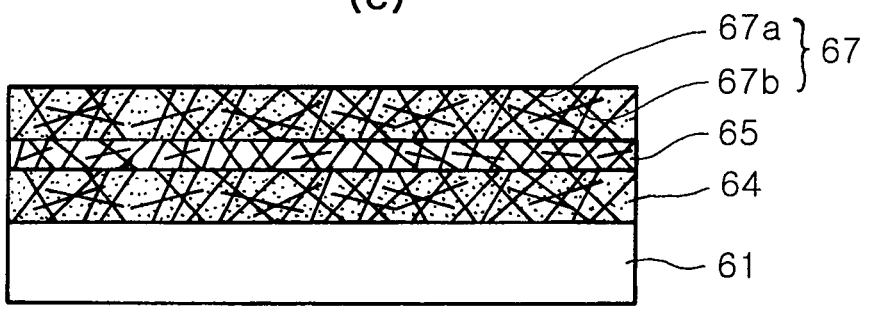

FIGS. 6a to 6c are cross-sectional views for explaining an exemplary process for manufacturing a nanowire light emitting device according to the invention. Unlike the light emitting devices shown in FIGS. 3 and 4, this embodiment illustrates an example in which first and second conductivity type clad layers and an active layer are formed by mixing a conductive polymer with a nanowire.

First, as shown in FIG. 6a, a substrate 61 is coated with a paste having a first conductivity type semiconductor nanowire 64a and a conductive polymer 64b mixed therein. Then heat treatment is performed to cure the paste into the first conductivity type clad layer 64. The coating process employed is selected from a group consisting of spin coating, spraying, screen printing, and ink jet printing. Unlike FIG. 4, the substrate is not aimed to grow a specific epitaxial layer such as a nitride semiconductor layer, and thus may utilize a conventional glass substrate.

Next, as shown in FIG. 6b, the active layer 65 is formed on the first conductivity type clad layer 64 in a similar manner. That is, the first conductivity type clad layer 64 is coated with a paste mixture having a semiconductor nanowire 65a manufactured as in FIGS. 5a and 5b and a transparent conductive polymer 65b. Then heat treatment is performed to cure the mixture into the active layer 65.

Thereafter, as shown in FIG. 6c, the active layer 61 is coated with a paste having a second conductivity type semiconductor nanowire 67a and a conductive polymer 67b mixed therein. Then heat treatment is performed to cure the paste into the second conductivity type clad layer 64. As a result, according to this embodiment of the invention, a conventional coating process may be employed to easily form all the layer structures necessary for the light emitting device.

As set forth above, according to preferred embodiments of the invention, a semiconductor nanowire is properly mixed with a conductive polymer to form an active layer, or other specific conductivity type clad layer, thereby easily manufacturing a desired light emitting device. The invention does not require an epitaxial layer to grow, thereby overcoming disadvantages such as a crystal defect.

Especially, a nanowire of an active layer may be composed of two different types of semiconductor materials emitting light at different wavelengths, thereby easily manufacturing a monolithic white light emitting device.

While the present invention has been shown and described in connection with the preferred embodiments, it will be apparent to those skilled in the art that modifications and variations can be made without departing from the spirit and scope of the invention as defined by the appended claims.

What is claimed is:

1. A nanowire light emitting device, comprising:
   a first conductivity type clad layer and a second conductivity type clad layer; and
   an active layer interposed between the first conductivity clad layer and second conductivity type clad layer, wherein:
   at least one of the first and second conductivity type clad layers is a semiconductor nanowire layer that includes semiconductor nanowires and a conductive polymer,
   the active layer is a semiconductor nanowire layer that includes semiconductor nanowires and a conductive polymer, and
   the conductive polymer of the active layer is transparent while the conductive polymer of the at least one of the first and second conductivity type clad layers is not transparent.

2. The nanowire light emitting device according to claim 1, wherein the semiconductor nanowires of the active layer comprise at least two types of semiconductor materials emitting light at different wavelengths.

3. The nanowire light emitting device according to claim 2, wherein the wavelengths of the semiconductor nanowire materials are combined to generate white light.

4. The nanowire light emitting device according to claim 1, wherein the semiconductor nanowires comprise a nitride semiconductor having a composition expressed by $Al_xGa_yIn_{1-x-y}N$, where $0 \leq x \leq 1$ and $0 \leq y \leq 1$.

5. The nanowire light emitting device according to claim 1, wherein the semiconductor nanowires are 70 to 95 volume % of the mixture.

6. The nanowire light emitting device according to claim 1, wherein the semiconductor nanowires have a length greater than 1.5 times or more with respect to a thickness of the semiconductor nanowire layer.

7. The nanowire light emitting device according to claim 1, wherein the semiconductor nanowire layer includes a pore space between the semiconductor nanowires.

8. A nanowire light emitting device, comprising:
a first conductivity type clad layer;
a second conductivity type clad layer; and
an active layer interposed between the first conductivity type clad layer and the second conductivity type clad layer, wherein:
the second conductivity type clad layer includes a semiconductor nanowire and a conductive polymer,
the first conductivity type clad layer is free of semiconductor nanowires,
the active layer includes a semiconductor nanowire and a conductive polymer, and
the conductive polymer of the active layer is transparent while the conductive polymer of the second conductivity type clad layer is not transparent.

* * * * *